United States Patent [19]

Jobbagy

[11] Patent Number: 4,484,177

[45] Date of Patent: Nov. 20, 1984

[54] ANALOG-TO-DIGITAL CONVERTER APPARATUS FOR CONDITION RESPONSIVE TRANSDUCER

[75] Inventor: Francis M. Jobbagy, Monroe, Conn.

[73] Assignee: Dresser Industries, Inc., Dallas, Tex.

[21] Appl. No.: 155,362

[22] Filed: Jun. 2, 1980

Related U.S. Application Data

[63] Continuation of Ser. No. 939,315, Sep. 5, 1978, abandoned.

[51] Int. Cl.³ ............................................. H03K 13/02
[52] U.S. Cl. ..................... 340/347 NT; 340/347 AD; 340/347 CC
[58] Field of Search .... 340/347 M, 347 NT, 347 AD, 340/347 CC

[56] References Cited

U.S. PATENT DOCUMENTS

| | | | |
|---|---|---|---|
| 3,617,885 | 11/1971 | Wheable | 340/347 NT |
| 3,654,560 | 4/1972 | Cath | 340/347 NT |
| 3,939,459 | 2/1976 | Hoopes | 340/347 NT |
| 3,942,173 | 3/1976 | Wold | 340/347 NT |
| 3,979,745 | 9/1976 | Bishop | 340/347 NT |
| 4,063,236 | 12/1977 | Amemiya | 340/347 NT |

FOREIGN PATENT DOCUMENTS

| | | |
|---|---|---|
| 2547785 | 5/1976 | Fed. Rep. of Germany ...... 340/347 NT |
| 1474970 | 5/1977 | United Kingdom . |

OTHER PUBLICATIONS

Product Literature of National Semiconductor Corp., "ADB4500 4½ Digit A/D Building Block", Apr. 1977, pp. 1–8.

Primary Examiner—C. D. Miller
Attorney, Agent, or Firm—Daniel Rubin

[57] ABSTRACT

An analog signal representing the measured output of a condition responsive transducer is supplied to a dual slope integrating analog-to-digital converter also receiving a regulated constant reference signal. Using the integrator in a non-inverting mode, the A/D converter operates in a single conversion cycle by first positively integrating a value of analog signal below a maximum negative input voltage for a fixed time period and then negatively integrating a voltage signal corresponding to the differential between the reference voltage signal and the maximum voltage for a variable time period to a comparative threshold. During integration, digital counts proportional to the variable integration period are accumulated and emitted for operating a digital device such as a digital display.

Digital linearization of the converter output can optionally be provided by use of a programmed microcomputer reading a programmable-read-only-memory (PROM) to run a variable frequency clock. The clock is regulated to effect a frist phase converter time corresponding with an even multiple of the power line frequency.

19 Claims, 4 Drawing Figures

4,484,177

ANALOG-TO-DIGITAL CONVERTER APPARATUS FOR CONDITION RESPONSIVE TRANSDUCER

This is a continuation of application Ser. No. 939,315, filed Sept. 5, 1978 now abandoned.

TECHNICAL FIELD

The technical field to which the invention pertains relates to the art of dual slope analog-to-digital converters for effecting a digital output signal of a measured analog signal being supplied to the converter.

BACKGROUND OF THE INVENTION

The dual slope type analog-to-digital slope converter for effecting a digital output signal from a measured analog input signal is well known as disclosed, for example, in U.S. Pat. Nos. 3,061,939; 3,316,546; 3,458,803, 3,660,834 and 3,566,397. Briefly, the method of conversion involves integrating a current directly related to an unknown voltage for a fixed period of time, followed by the integration of a standard current related to a reference voltage of opposite polarity until the integrator output returns to zero. The total time period required to null the integrator is directly proportional to the ratio of the measured current to the standard current, and, therefore, to the measured voltage. The integrator, therefore, is a circuit producing a linearly changing output with time (usually a ramp) when the input is some constant voltage and the rate of integrator output voltage increase is directly proportional to the magnitude of input voltage. When input voltage is zero, output voltage is not subject to change but remains zero at whatever output value was achieved at the beginning of the time period.

Standard operation for such prior art converters has included integration of the unknown in the same direction of polarity as the input signal, e.g. positive-to-positive which is then switched to a reference signal of opposite polarity that is integrated to zero. This is then detected by a comparator of the integrated signals and for large analog inputs prolonged time periods are required to effect the zero integration. The digital counts are then accumulated in a register proportional to the time factor associated with the unknown integration.

While this basic arrangement has functioned well with a high order of accuracy, it requires reference switching and polarity detection which becomes difficult at very low inputs leading to switching uncertainties. Also, bias currents associated with these prior devices have added and subtracted from the slopes in each of its changed directions. For overcoming these deficiencies, it has been necessary to utilize precision low offset amplifiers. Despite recognition of the foregoing, means for effecting their elimination has not heretofore been known.

SUMMARY OF THE INVENTION

This invention relates to analog-to-digital conversion apparatus for effecting a digital output signal correlated to an analog signal being emitted from a condition responsive transducer. More specifically, the invention relates to an A/D converter of the dual slope type able to eliminate the reference switching and bias current problems characteristic of such prior art converters whereby to enhance the overall accuracy and reliability of such systems. Optionally, a further feature also affords enhanced linearization of the output signal.

The foregoing is achieved in accordance with the invention by always integrating the unknown analog input signal in a direction polar opposite to a reference signal enabling one of the two prior used reference signals to be eliminated. At the same time there is afforded the ability to both measure and verify polarity of the input signal without regard to the signal level. By using the integrator in a non-inverting mode, the A/D converter integrates positively all the analog signal values below a maximum negative input voltage while accumulating digital counts proportional to the differences therebetween. A digital display or other appropriate digital device is then operated by the count signals received from the converter. Optionally, digital linearization of the count signals can be provided for correcting any encountered deviation from ideal linearity. This is achieved by a programmed microcomputer reading a PROM to run a variable frequency clock via the PROM programming. The clock frequency is regulated to effect a first phase converter time that corresponds with an even multiple of the power line frequency. Accumulator counts will then vary directly with clock frequency.

It is therefore an object of the invention to provide novel modifications to an analog-to-digital converter of the dual slope type for effecting a digital output signal correlated to a transducer provided analog signal.

It is a further object of the invention to effect the previous object with modifications that effectively eliminate the reference switching and bias current problems characteristic of similar purpose prior art A/D converters.

Figure 1:
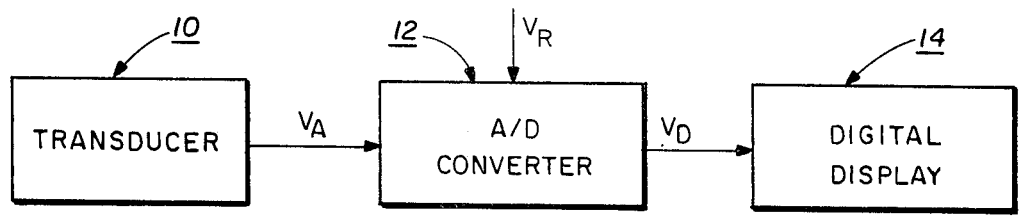
FIG. 1 is a block diagram of a system apparatus embodying the invention.

Referring first to FIG. 1, there is disclosed a transducer 10 adapted to continuously emit an analog signal $V_a$ correlated to the measured value of a condition being measured by the transducer. Transducer 10 can typically be any suitable type measuring instrument from which an analog output can be obtained and in a preferred use may constitute a pressure or temperature transducer as disclosed, for example, in U.S. Pat. Nos. 3,742,233 or 4,109,147. Analog signal $V_a$ from the transducer, along with a reference signal $V_r$ of a known regulated voltage as will be explained are both supplied to A/D converter 12 in accordance herewith to in turn emit a count signal $V_d$ for any of a variety of applications such as for operating a digital display 14.

Figure 2:
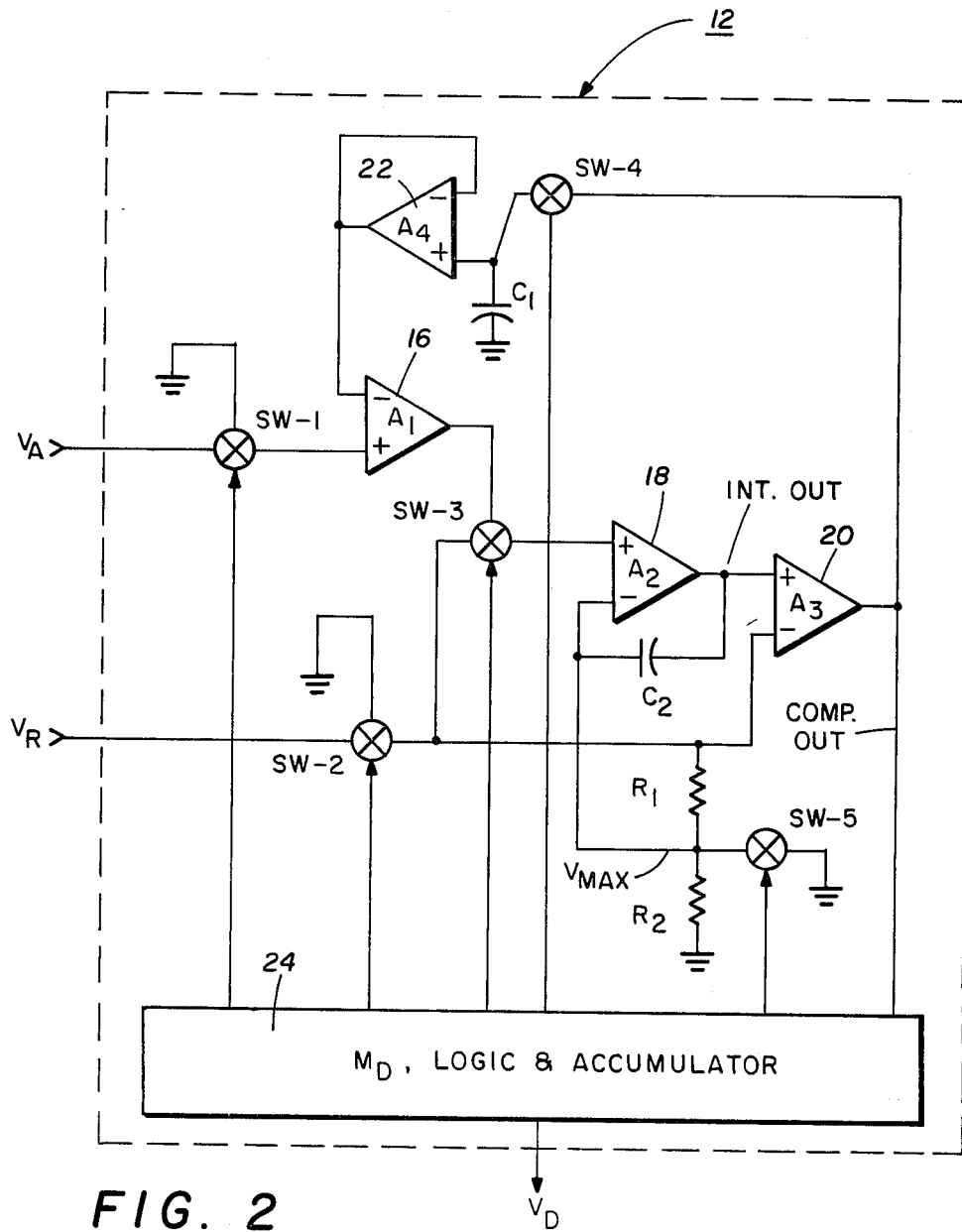
FIG. 2 is an electronic schematic of the modified dual slope A/D converter hereof.

Referring now to FIG. 2, the modified A/D dual slope converter 12 hereof is comprised of a summing amplifier 16, an integrator 18, a comparator and auto-zero amplifier 20, a sample/hold amplifier 22 and a logic and accumulator module 24 which for the embodiment being described is of a commercially available type similar to National Semiconductor MM5330 A/D Building Block operative as will be explained below. Analog signal $V_a$, being supplied from transducer 10 in correlation to its measured parameter, is of negative polarity for connection directly through switch SW-1 to summing amplifier 16, while reference voltage $V_r$, being supplied from a regulated voltage source, is of negative polarity for connection through switch SW-2 to comparator and auto-zero amplifier 20. The output of amplifier 16 is provided through switch SW-3 to the positive terminal of integrator 18 while a $V_{max}$ voltage is derived from Vr through dividers $R_1$ and $R_2$ for feeding the negative terminal of integrator 18. By way of example, if maximum positive voltage at Va=1.9999 volts, $V_{max}$ would arbitrarily be set at 2.2000 volts and at Va=zero measurement would be based on 2.2000 volts. Logic and accumulator module 24 provides the logic for sequencing the aforementioned switches.

Figure 3:
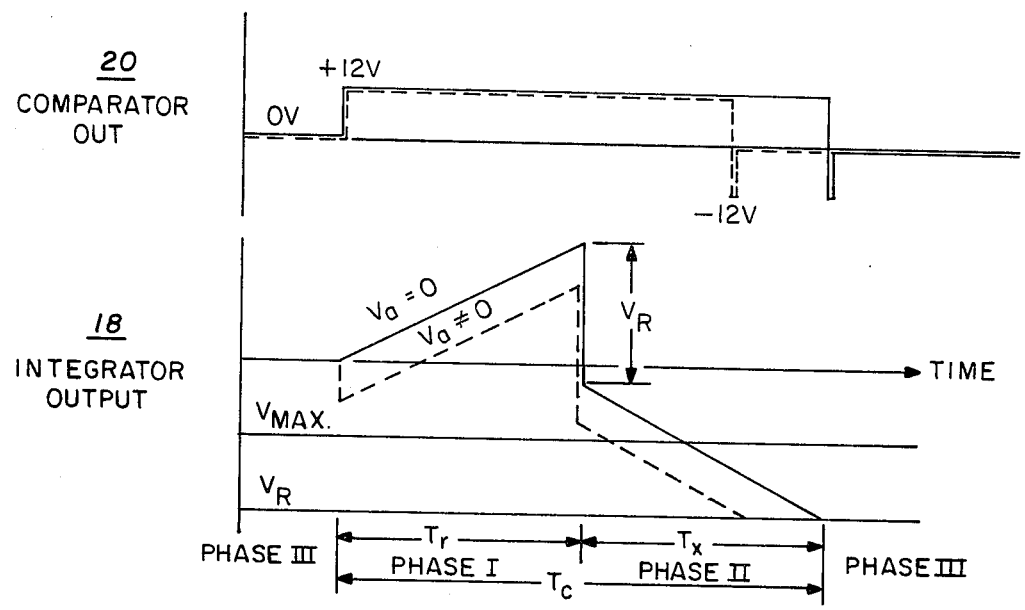
FIG. 3 is a timing diagram for the dual slope converter of FIG. 2 at zero and non-zero signal levels.

With reference also to FIG. 3, the complete A/D conversion cycle of transducer signal Va is shown in which VA=0 volts is the solid slope and Va≠0 volts for a measured value not equal to zero has a dashed slope. The cycle from left to right (FIG. 3) consists of three phases being auto-zero phase III, the integrator reference phase I for a predetermined fixed time period $T_r$ and the integrated unknown phase II for a variable time period Tx. During phase III, comparator and auto-zero amplifier 20 functions as a high gain zeroing amplifier that with switch SW-4 closed, drives sample/hold amplifier 22, capacitor C-1 and inverting summing amplifier 16 through switch SW-3 to restore the integrator capacitor C-2 voltage to zero volts. Switches SW-1, SW-2 and SW-5 during this phase are all in grounded position. Also, because of the characteristics of amplifier 22, all amplifier voltage offsets are stored on capacitor C-1 where they remain through the integration cycle serving to eliminate even large offset voltages.

During phase I, in response to a received power line sync signal, switches SW-4 and SW-5 are opened. Reference voltage Vr is applied through switch SW-2 to amplifier 20 for simultaneously establishing $V_{max}$ via divider $R_1$ and $R_2$. $V_{max}$ is chosen based on the full scale counts desired. At the same time, Va is connected to the input integrator 18 via summing amplifier 16 and switch SW-3. The output of integrator 18 then slews to VA for integration to begin for a reference period Tr during which time integration occurs for a signal value based on the differential between ($V_{max}$−Va). Time Tr is preferably selected to be of some even multiple of the local power line frequency for increasing the normal mode noise rejection of the converter.

On completion of phase I, phase II is initiated during which reference voltage Vr is applied to integrator 18 for the unknown period Tx until the threshold of comparator 20 is crossed in its comparison between the signal levels of Vr and the integrator output. At such time, coincident with the comparator output, the digital counts which accumulated during integration period Tx are transferred from the counter to the latches, the parallel output signal of which $V_d$ is applied to display unit 14 or transmitted elsewhere as desired. The latter can be understood by the following example in which:

$$Tr = \frac{C_o}{C_f}$$

Where $C_o$ = counts overflow
$C_f$ = clock frequency (HZ)
assuming third harmonic of 60 Hz = .050 sec.
and $C_o$ = 18000 then
$C_f$ = 36000 HZ
Where Va equal zero and $V_{max}$ is measured, a complete conversion will occur on the basis of:

-continued
$T_c = Tr + Tx$ (FIG. 3)

$$T_c = \frac{18000}{360000} + \frac{22000}{360000} = 0.111111 \text{ sec.}$$

For any positive Va less than $V_{max}$ the code converter 9's complements the counter to display the measured value. In this manner, display 14 yields a linear conversion for Va less than $V_{max}$.

Figure 4:
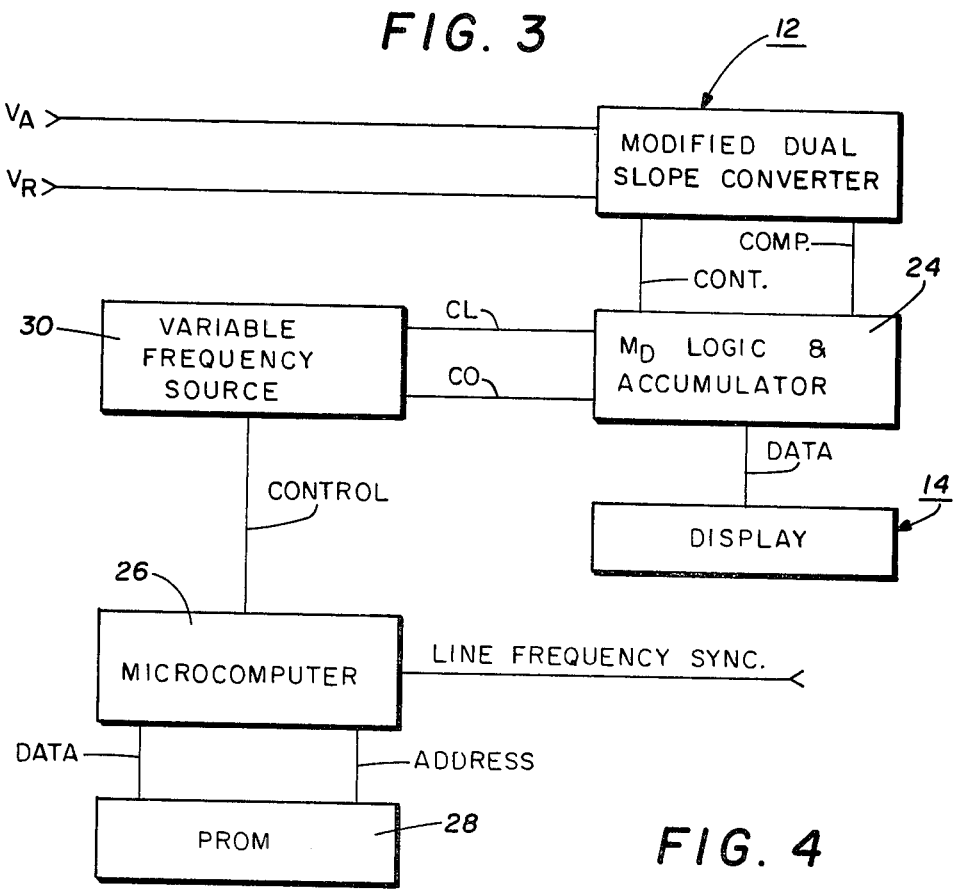
FIG. 4 is an optional variation for the dual slope converter of FIG. 2 for affording digital linearization.

For effecting digital linearization usable with A/D converter 12 or with any dual slope standard system, reference is made to FIG. 4 in which there is shown a schematic circuit therefor including a microcomputer 26, a PROM 28 and a variable frequency clock source 30 connected to logic and accumulator module 24. During phase I (FIG. 3), microcomputer 26 reads PROM 28 for receipt of programmed information to drive clock 30 at a frequency such that Tr is an even multiple of the power line frequency. Each of microcomputer 26, PROM 28 and clock 30 are commercially available from various manufacturers. Microcomputer 26 can, for example, comprise a single chip microcomputer manufactured by Fairchild Camera and Instrument or Mostek Corp. under the designation "F3870" while PROM 28 can be obtained from either Signetics under their commercial designation "DM74S188" or from Texas Instruments under their commercial designation "SN74188". Oscillator 30 is available as a 74LSO4 gate with crystal feedback while the counters are 74LS193 types, both manufactured by various integrated circuit manufacturers such as National Semiconductor.

Phase II is sensed by the microcomputer on the convert line Co and based on information received from PROM 28 drives the frequency of clock 30 at various rates per unit time as programmed into PROM 28. In this manner, clocking frequencies that are different between phases II and I do not affect the conversion time which instead remains constant for a given input voltage Va. Integrator 18 functions in the same manner as described above while the counts accumulated during time period Tx will vary more directly dependent on the frequency of clock 30. Should Va be a non-linear response of some linear function being measured, the final accumulated counts are therefore adjusted in that manner to yield a linear digital representation of the measurement.

If, for example, different clocking frequencies are utilized during phase II than Phase I, the conversion time nevertheless remains the same for a given input voltage Va since integrator 18 makes the same excursion. The counts accumulated during Tx will be more or less depending on the frequency of clock 30 such that the accumulated counts over the course of Tx can be varied in direct relation to the value of Va. Using the previous example and varying the clocking frequency a number of times (n) then when n=5

$$Tn = \frac{Tx}{5} = .0122222 \text{ and}$$

$Nt = Tn (F_2) + Tn (F_3) + Tn (F_4) + Tn (F_5) + Tn (F_6)$
where $F_1$ = clock frequency during $Tr$ = 360 KHZ
$F_2$ = clock frequency during $Tx$ = 350
$F_3$ = clock frequency during $Tx$ = 340
$F_4$ = clock frequency during $Tx$ = 300
$F_5$ = clock frequency during $Tx$ = 360
$F_6$ = clock frequency during $Tx$ = 450

Nt=21997 and if the dual slope converter hereof reaches crossover Tx=0.0066666 seconds, three corrections have occurred and the display will read:

$$22000 - Tn\ (F_1 + F_2 + F_3) = 9902\ \text{counts}$$

In the same example with a constant clocking frequency $$Tx = 0.0611111\quad Tn = 0.0122222$$

giving an Nt=21999 and Linear Display=22000−13200=8800 counts.

Comparison of the above examples shows that in both cases the total number was essentially the same but the non-linear accumulation resulted in a 1102 count increase for a given Va=Tx.

By the above description there is disclosed a novel modification of an analog-to-digital dual slope type converter able to give a linear digital representation of a non-linear analog signal representing the measured output of a condition responsive element. By use of relatively inexpensive non-critical components, the precision elements required for eliminating the inherent problems of standard dual slope systems are thereby avoided. When employing linearization in accordance herewith, greater flexibility is afforded as compared to analog summing techniques previously utilized. Moreover, the linearization attains the precision of a digital correction that is highly repeatable and inherently temperature stable with the ability to tailor the response from one instrument to the other. Whereas the linearization has been described in combination with the modified dual slope converter hereof, it is not intended to be so limited since it could be readily utilized with such standard unmodified dual slope converters of the prior art.

Since many changes could be made in the above construction and many apparently widely different embodiments of this invention could be made without departing from the scope thereof, it is intended that all matter contained in the drawings and specification shall be interpreted as illustrative and not in a limiting sense.

The embodiments of the invention in which an exclusive property or privilege is claimed are defined as follows:

1. In a dual slope analog-to-digital converter for emitting a digital output signal corresponding to an analog signal being received, single cycle conversion means operative to convert the received analog signal to a digital output signal in a single up-down integration cycle and comprising first input means for receiving an analog voltage signal to be converted, second input means for receiving a reference voltage signal, means for deriving a predetermined max. voltage signal from the voltage signal of said second input means, means establishing a datum level voltage, integrator means operative seriatim to integrate a first signal corresponding to the differential between the derived max. voltage signal and the received analog signal for a predetermined time period and on expiration of said predetermined time period to integrate a second signal corresponding to the differential between said reference voltage signal and said max. voltage signal, comparator means adapted to receive said integrated signals for effectively varying the integration time period of said second signal until a predetermined threshold level is achieved between the integrated second signal output of said integrator means and said datum level voltage, switching means for switching in a feedback path from the comparator means output to the integrator means automatically to restore the integrator prior to each said integration cycle and signal emitting means for emitting a digital output signal derived from an accumulative digital count correlated to the time span of said variable time period.

2. In a dual slope converter according to claim 1 in which said integrating means is operative in a non-inverting mode.

3. In a dual slope converter according to claim 2 in which said comparator effectively varies said variable time period in proportion to the level of analog signal received at said first input means.

4. In a dual slope converter according to claim 3 in which said integrator means is operative to integrate said first signal value in a direction polar opposite to the polarity of the received reference signal.

5. In a dual slope converter according to claim 4 in which the predetermined time period of said integrator means comprises an even multiple of the power line frequency with which the converter is to be utilized.

6. In a dual slope converter according to claim 4 including linearization means operative to correct for non-linearity in the digital count from which the output signal of said signal emitting means is derived.

7. In a dual slope converter according to claim 6 in which said linearization means includes a variable frequency clock and means operative to drive said clock during said predetermined time period of said integrator means at a frequency comprising an even multiple of the power line frequency at which converter is to be used and to drive said clock during said variable time period at controlled changes in frequency per unit of time in accordance with deviation from linearity of the analog signal being received at said first input.

8. In a dual slope converter according to claim 7 in which said linearization means includes a programmable-read-only-memory (PROM) programmed to change the clock frequency at varying rates per unit of time during said variable time period.

9. A digital output system for continuously emitting a digital signal corresponding to values of a measured condition, the combination comprising a condition responsive transducer adapted to be exposed to the condition to be measured and operative to emit an analog voltage signal continuously correlated to the measured value thereof, a dual slope analog-to-digital converter, said converter having means for effecting single cycle conversion operative to convert the received analog signal to a digital output signal in a single up-down integration cycle and including first input means for receiving the analog voltage signal emitted by said transducer, second input means for receiving a reference voltage signal, means for deriving a predetermined max. voltage signal from the voltage signal of said second input means, means establishing a datum level voltage, integrator means operative seriatim to integrate a first signal corresponding to the differential between the derived max. voltage signal and the received analog signal for a predetermined time period and on expiration of said predetermined time period to integrate a second signal corresponding to the differential between said reference voltage signal and said max. voltage signal, comparator means adapted to receive said integrated signals for effectively varying the integration time period of said second signal until a predetermined threshold level is achieved between the integrated second signal output of said integrator means and said datum level voltage, switching means for switching in a feedback path from the comparator means output to the integrator means automatically to restore the integrator prior to each said integration cycle and signal emitting means for emitting a digital output signal derived from an accumulative digital count correlated to the time span of said variable time period, and utilization means for receiving the emitted signal of said signal emitting means.

10. A system according to claim 9 in which said converter integrating means is operative in a non-inverting mode.

11. A system according to claim 10 in which said comparator effectively varies said variable time period in proportion to the level of the received transducer signal.

12. A system according to claim 11 in which said converter integrator means is operative to integrate said first signal value in a direction polar opposite to the polarity of the received reference signal.

13. A system according to claim 12 in which the predetermined time period of said converter integrator means comprises an even multiple of the power line frequency with which the system is to be utilized.

14. A system according to claim 12 including linearization means operative to correct for non-linearity in the digital count from which the output signal of said signal emitting means is derived.

15. A system according to claim 12 in which said transducer is temperature sensitive for emitting an analog signal correlated to the temperature of the measured condition.

16. A system according to claim 12 in which said transducer is pressure sensitive for emitting an analog signal correlated to the pressure of the measured condition.

17. A system according to claims 9, 13, 14, 15 or 16 in which said utilization means comprises a digital display device.

18. A system for linearizing the digital output of a dual slope analog-to-digital converter comprising a variable frequency clock and means operative to drive said clock during the fixed time period of said converter at a frequency comprising an even multiple of the power line frequency at which the converter is to be used and to drive said clock during the variable time period at controlled changes in frequencies per unit of time in accordance with deviation from linearity of the analog signal being received by the converter.

19. A system according to claim 18 including a programmable-read-only-memory (PROM) programmed for effecting said clock frequency changes during the variable time period.

* * * * *